(12) United States Patent
Kutter et al.

(10) Patent No.: US 12,154,878 B2
(45) Date of Patent: *Nov. 26, 2024

(54) SEMICONDUCTOR DEVICE

(71) Applicant: Intel Corporation, Santa Clara, CA (US)

(72) Inventors: Christoph Kutter, Munich (DE); Ewald Soutschek, Neubiberg (DE); Georg Meyer-Berg, Munich (DE)

(73) Assignee: Intel Corporation, Santa Clara, CA (US)

( * ) Notice: Subject to any disclaimer, the term of this patent is extended or adjusted under 35 U.S.C. 154(b) by 229 days.

This patent is subject to a terminal disclaimer.

(21) Appl. No.: 17/855,658

(22) Filed: Jun. 30, 2022

(65) Prior Publication Data
US 2022/0336399 A1 Oct. 20, 2022

Related U.S. Application Data

(60) Continuation of application No. 17/552,550, filed on Dec. 16, 2021, now Pat. No. 11,848,294, which is a (Continued)

(51) Int. Cl.
*H01L 23/00* (2006.01)
*H01L 21/683* (2006.01)
(Continued)

(52) U.S. Cl.
CPC .......... *H01L 24/14* (2013.01); *H01L 21/6835* (2013.01); *H01L 23/12* (2013.01); (Continued)

(58) Field of Classification Search
CPC ......... H01L 23/12; H01L 23/14; H01L 23/48; H01L 23/535; H01L 23/538; H01L 23/5381; H01L 23/5389; H01L 23/49811; H01L 23/5221; H01L 23/49838; H01L 24/19; H01L 21/14; H01L 2224/32151; H01L 2224/32225; H01L 2224/12105; H01L 2924/15311
See application file for complete search history.

(56) References Cited

U.S. PATENT DOCUMENTS 4,000,054 A 12/1976 Marcantonio
5,095,352 A 3/1992 Noda
(Continued)

FOREIGN PATENT DOCUMENTS

DE 4032370 A1 4/1992

OTHER PUBLICATIONS

Notice of Allowance from U.S. Appl. No. 17/552,550, mailed Aug. 22, 2023, 10 pgs.
(Continued)

*Primary Examiner* — Tuan A Hoang
(74) *Attorney, Agent, or Firm* — Schwabe, Williamson & Wyatt, P.C.

(57) ABSTRACT

A semiconductor device including a semiconductor chip having a first conduction element; a substrate having second and third conduction elements; and external connection elements configured to form an electrical path between the second and third conduction elements via the first conduction element.

20 Claims, 11 Drawing Sheets

Related U.S. Application Data division of application No. 16/866,109, filed on May 4, 2020, now Pat. No. 11,233,027, which is a continuation of application No. 16/221,000, filed on Dec. 14, 2018, now Pat. No. 10,679,959, which is a continuation of application No. 14/669,219, filed on Mar. 26, 2015, now Pat. No. 10,529,678, which is a division of application No. 13/152,971, filed on Jun. 3, 2011, now abandoned, which is a continuation of application No. 11/965,081, filed on Dec. 27, 2007, now abandoned.

(51) Int. Cl.
| | | |
|---|---|---|
| *H01L 23/12* | (2006.01) | |
| *H01L 23/48* | (2006.01) | |
| *H01L 23/50* | (2006.01) | |
| *H01L 23/538* | (2006.01) | |
| *H01L 21/56* | (2006.01) | |

(52) U.S. Cl.
CPC .............. *H01L 23/48* (2013.01); *H01L 23/50* (2013.01); *H01L 23/5381* (2013.01); *H01L 23/5389* (2013.01); *H01L 24/06* (2013.01); *H01L 24/19* (2013.01); *H01L 24/96* (2013.01); *H01L 21/568* (2013.01); *H01L 2224/02* (2013.01); *H01L 2224/0401* (2013.01); *H01L 2224/04105* (2013.01); *H01L 2224/12105* (2013.01); *H01L 2224/16227* (2013.01); *H01L 2224/16235* (2013.01); *H01L 2224/20* (2013.01); *H01L 2224/92* (2013.01); *H01L 2924/01005* (2013.01); *H01L 2924/01013* (2013.01); *H01L 2924/01029* (2013.01); *H01L 2924/01068* (2013.01); *H01L 2924/014* (2013.01); *H01L 2924/15174* (2013.01); *H01L 2924/15311* (2013.01); *H01L 2924/15312* (2013.01); *H01L 2924/15313* (2013.01); *H01L 2924/181* (2013.01); *H01L 2924/19015* (2013.01); *H01L 2924/19042* (2013.01); *H01L 2924/19104* (2013.01)

(56) References Cited

U.S. PATENT DOCUMENTS

| | | | |
|---|---|---|---|
| 5,097,895 | A | 3/1992 | Assaf |
| 5,497,027 | A | 3/1996 | Crafts |
| 5,898,223 | A | 4/1999 | Frye |
| 6,498,396 | B1 | 12/2002 | Arimoto |
| 6,638,607 | B1 | 10/2003 | Curcio |
| 6,838,776 | B2 * | 1/2005 | Leal ..................... H01L 21/565 |
| | | | 438/106 |
| 6,841,862 | B2 | 1/2005 | Kikuchi |
| 6,845,554 | B2 | 1/2005 | Frankowsky et al. |
| 6,963,136 | B2 * | 11/2005 | Shinozaki ........... H01L 23/5286 |
| | | | 257/E23.021 |
| 7,176,506 | B2 | 2/2007 | Beroz |
| 10,679,959 | B2 | 6/2020 | Kutter |
| 11,233,027 | B2 * | 1/2022 | Kutter ..................... H01L 24/06 |
| 2002/0024136 | A1 | 2/2002 | Grigg |
| 2002/0132413 | A1 | 9/2002 | Chang et al. |
| 2003/0198032 | A1 | 10/2003 | Collander |
| 2005/0160575 | A1 | 7/2005 | Gambino |
| 2007/0108580 | A1 | 5/2007 | Goller |
| 2010/0109169 | A1 | 5/2010 | Kolan |

OTHER PUBLICATIONS

M. Brunnbauer, et al. "Embedded Water Level Ball Grid Array (eWLB)", Electronics Packaging Technology Conference, 2006.
Office Action for Germany Patent Application No. 102008064373.4 mailed Feb. 21, 2013, 3 pgs., no translation.
Notice of Allowance for Germany Patent Application No. 102008064373.4 mailed Nov. 5, 2013, 6 pgs., no translation.
Office Action from U.S. Appl. No. 17/552,550, mailed Mar. 28, 2023, 9 pgs.

* cited by examiner

SEMICONDUCTOR DEVICE

RELATED APPLICATIONS

This is a Continuation of U.S. patent application Ser. No. 17/552,550, filed Dec. 16, 2021, which is a Divisional of U.S. patent application Ser. No. 16/866,109, filed May 4, 2020, now U.S. Pat. No. 11,233,027, issued Jan. 25, 2022, which is a Continuation of U.S. patent application Ser. No. 16/221,000, filed Dec. 14, 2018, now U.S. Pat. No. 10,679,959, issued Jun. 9, 2020, which is a Continuation of U.S. patent application Ser. No. 14/669,219, filed Mar. 26, 2015, now U.S. Pat. No. 10,529,678, issued Jan. 7, 2020, which is a Divisional application of U.S. patent application Ser. No. 13/152,971 filed Jun. 3, 2011, now abandoned, which is a Continuation U.S. patent application Ser. No. 11/965,081 filed Dec. 27, 2007, now abandoned, the disclosures of which are hereby incorporated by reference in their entireties.

This disclosure refers to embodiments of semiconductor devices and methods for their production, particularly the electrical connection between a semiconductor chip and its supporting structure.

BACKGROUND

In the production of semiconductor devices, small contact elements on the semiconductor chip have to be connected to electrical terminals which provide a contact to the outside world. These connections are generally realized as part of the package or encapsulation of the semiconductor chip, e.g. by providing a metallization layer on a face of the chip which provides conducting elements or lines connecting the contact elements of the chip to contact elements on an outer face of the package, e.g. solder balls. Especially with high pin counts, the problem frequently occurs that the high number of conducting lines in the layer cannot be arranged without crossings between at least some of the lines. In a single metallization layer, a crossing of two lines can not be realized because this would cause an electrical shortcut between the lines. Hence, in this case a second metallization layer has to be provided in order to arrange the connections between the chip and the contact elements to the outside.

SUMMARY

According to an embodiment, a semiconductor device is provided. It includes a semiconductor chip which includes a first conducting element. A second conducting element outside the semiconductor chip is electrically connected to the first conducting element arranged at a first location. A third conducting element outside the semiconductor chip is electrically connected to the first conducting element at a second location. A fourth conducting element is also provided arranged outside the semiconductor chip. In a vertical projection of the fourth conducting element on the chip, the projection crosses the first conducting element between the first location and the second location.

According to a further embodiment, a semiconductor device is provided. It includes a semiconductor chip including at least two contact elements and a first conducting element located in the chip, and a layer of conducting elements arranged adjacent the chip, which include a contact region providing an interface to the outside of the semiconductor device. It further includes second and third conducting elements connected to the first conducting element located in the chip via contact elements, so that the second and third conducting elements are electrically connected via the first conducting element, and wherein the second conducting element is connected to the contact region. According to a further embodiment, there is provided a method of manufacturing semiconductor devices, which includes providing at least two semiconductor chips that each comprise a first conduction line, covering the at least two semiconductor chips with mold material, applying a metallization layer over the at least two semiconductor chips and the mold material such that the metallization layer contacts each of the first conduction lines at at least two separated locations, and separating the at least two semiconductor chips from each other after the application of the metallization layer.

According to a further embodiment, there is provided a method of manufacturing semiconductor devices, which includes providing a semiconductor chip having a first conducting element, which is connected to two contact elements on a face of the chip, and providing a layer of conducting elements on a face of the chip, wherein a second conducting element and a third conducting element of the layer of conducting elements are connected to the first conducting element located in the chip via contact elements, so that the second and third conducting elements are electrically connected via the first conducting element, and a vertical projection of a fourth conducting element of the layer of conducting elements crosses the first conducting element.

BRIEF DESCRIPTION OF THE SEVERAL VIEWS OF THE DRAWINGS

A full and enabling disclosure, including the best mode thereof, to one of ordinary skill in the art, is set forth more particularly in the remainder of the specification, including reference to the accompanying figures. Therein.

DETAILED DESCRIPTION

Reference will now be made in detail to various embodiments, one or more examples of which are illustrated in the figures. Each example is provided by way of explanation, and is not meant as a limitation. For example, features illustrated or described as part of one embodiment can be used on or in conjunction with other embodiments to yield yet a further embodiment. It is intended that the present disclosure includes such modifications and variations. The examples are described using specific language which should not be construed as limiting the scope of the appending claims. The drawings are not scaled and are for illustrative purposes only.

The term "connected" is used in this context for a direct connection of two elements, which includes that the elements are electrically connected. The term "electrically connected" means that two elements are in electrical contact, but can be connected over an intermediate element, hence they need not be directly connected. The terms "conducting element" and "conducting line" are used interchangeably in this description.

A concept underlying the design of the embodiments below is the functional separation between the layout of the semiconductor chip and the layout of the package, printed circuit board or substrate. This is achieved by using a conducting element in the semiconductor chip to enable crossings of conducting lines in redistribution layers, printed circuit boards or substrates without the need of implementing further layers. In the following, this concept is described for a number of embodiments.

Figure 1A:
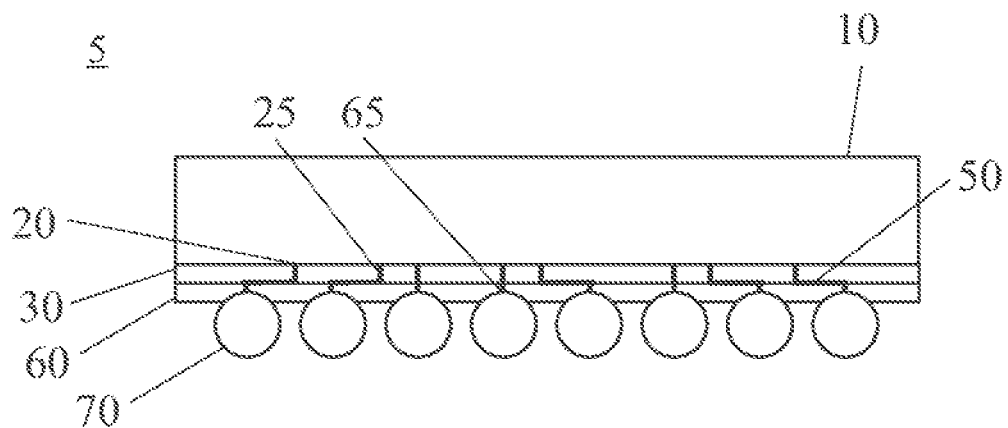
FIG. 1a-1b show a semiconductor device.
Figure 1B:
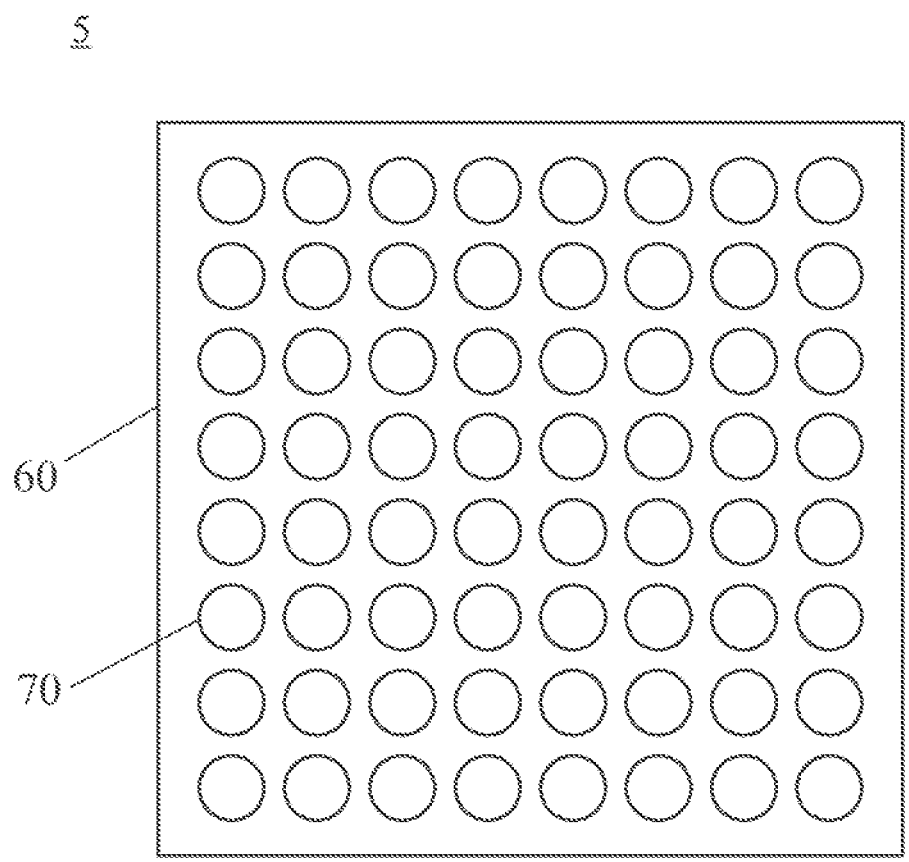
Figure 2A:
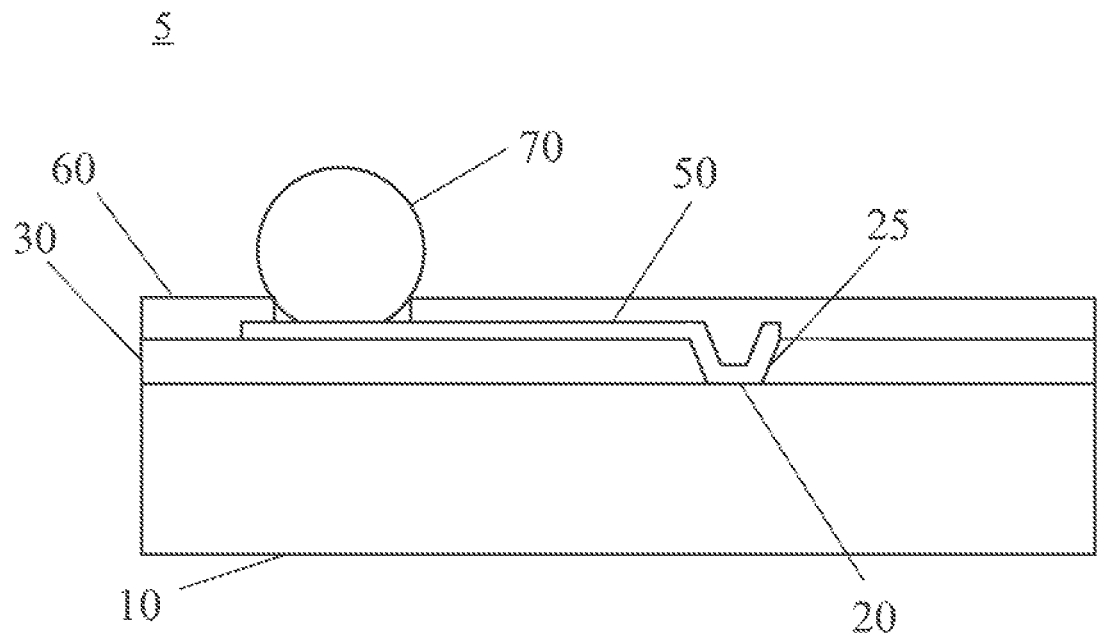
FIG. 2a shows a schematic cross-sectional view of the semiconductor device.
Figure 2B:
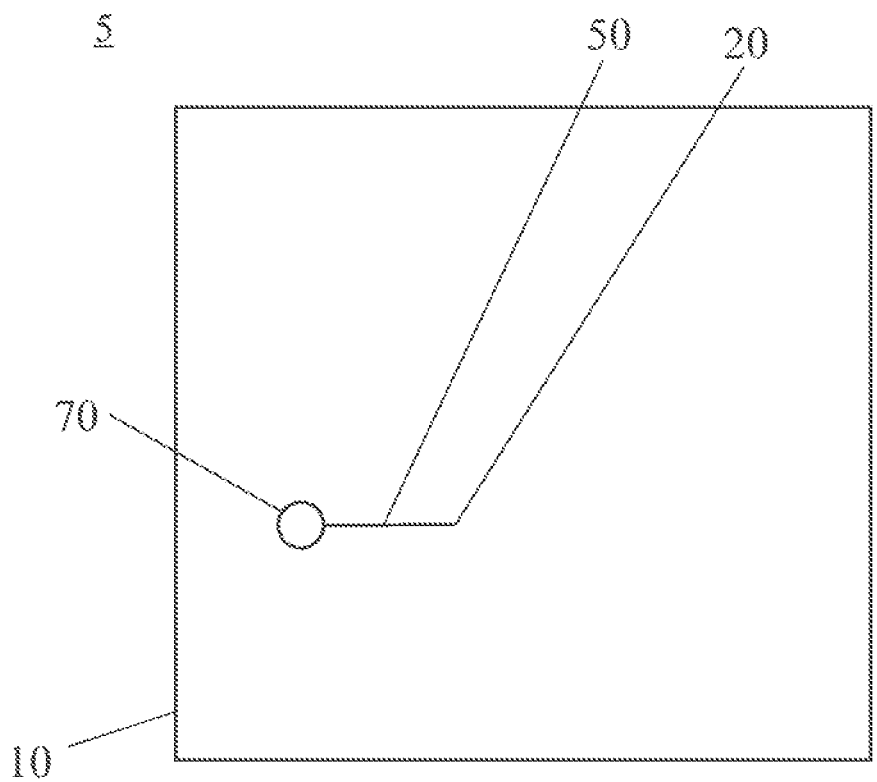
FIG. 2b shows a schematic perspective view of the semiconductor device.

FIGS. 1a and 1b show an example of a typical semiconductor device 5 employing a fan-in wafer level ball grid array, also known as wafer level package or WLP. The semiconductor chip 10 includes a number of contact elements 20 on a face. A first dielectric layer 30, which typically includes silicone, is applied to the face of the chip. A metallization layer including copper or aluminum is provided on the first dielectric layer. The metallization layer is structured by etching during the manufacturing process in order to provide a number of conducting elements 50 (also referred to as conducting lines in the following). In a typical manufacturing process, the metal is sputtered on the first dielectric layer 30, covered with a resist layer, and exposed to radiation employing an exposure mask. After a development process, the produced structure is plated and stripped. A typical thickness of the produced structure of metallic conducting elements is in the range from 3 to 20 μm, more preferred from 4 to 8 μm. A typical width of the resulting conducting lines is 20 μm. Through contact holes 25 in the first dielectric layer 30, the conducting lines are in contact with the contact elements 20 or contact pads on the chip. A second dielectric layer 60 on the metallization layer typically includes polyimide. Via holes 65, the conducting lines 50 are in electrical contact with solder balls 70, also referred to herein as external connecting element, which are placed on holes of the second dielectric layer 60. FIG. 1b shows a bottom view on the described semiconductor device. In FIG. 2a, a more detailed sectional view of the structure of FIG. 1a is shown. FIG. 2b shows a schematic view of the semiconductor device, wherein only one conduction line 50 and solder ball 70 are shown out of the plurality of conducting elements which form the layer of conducting elements.

Figure 3A:
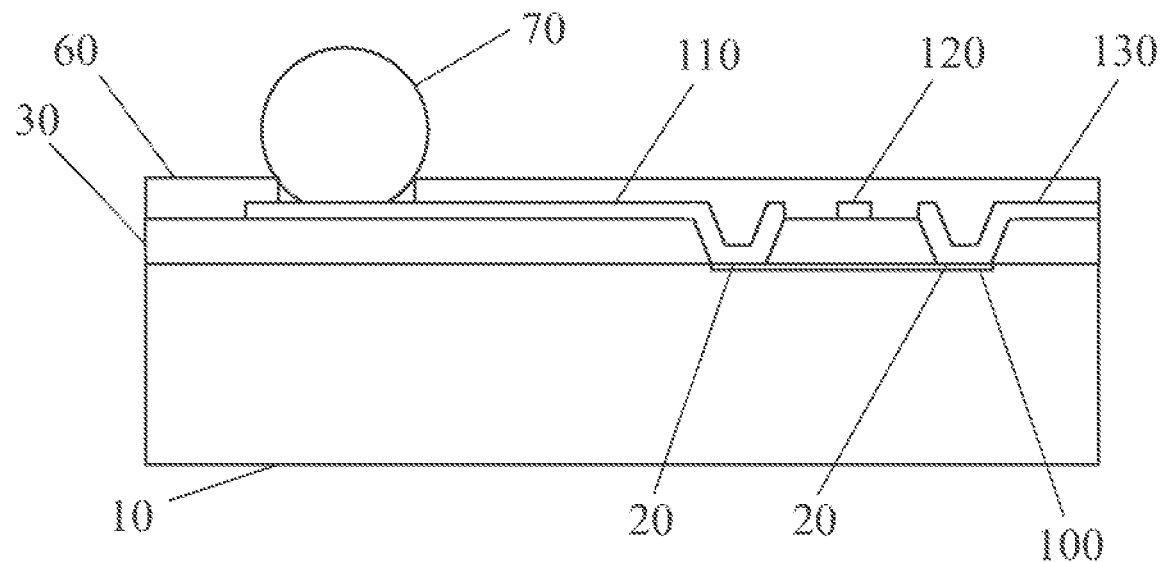
FIG. 3a shows a cross-sectional view of a semiconductor device according to an embodiment.
Figure 3B:
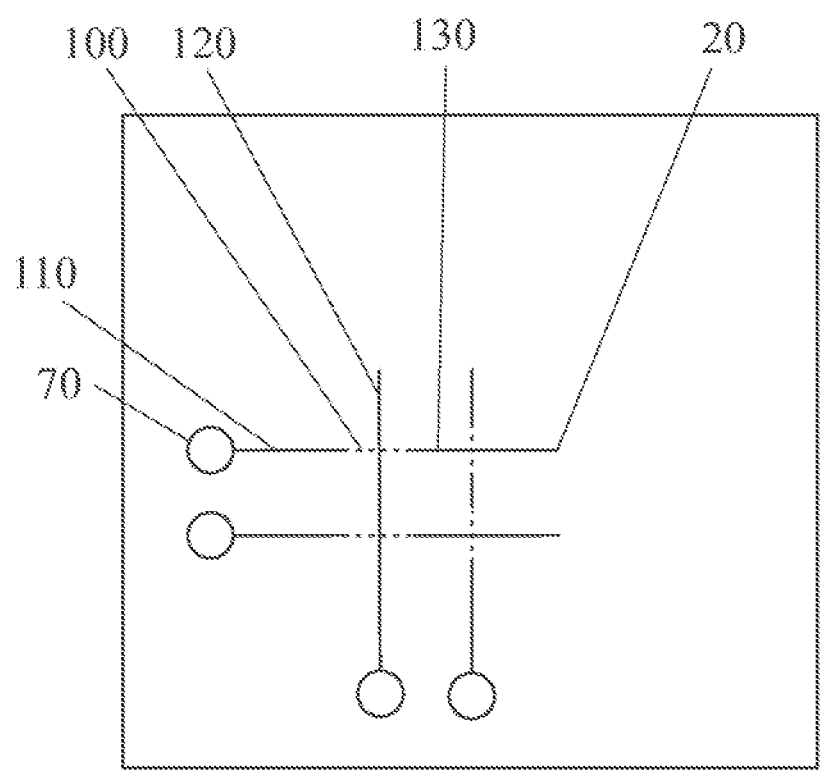
FIG. 3b shows a schematic view of a semiconductor device according to an embodiment.

FIG. 3a shows a further embodiment. Based on the semiconductor device 5 as shown in FIGS. 1a, 1b, 2a and 2b, a conducting line or conducting element 100, also referred to herein as first conducting element, provided in the chip 10 serves as a functional part of the layer of conducting elements, of which three elements 110, 120, 130, also referred to herein as second, fourth, and third conducting elements, respectively, are exemplarily depicted in FIG. 3a. Conducting elements 110 and 130 are electrically connected via the conducting element 100 in the chip. Conducting element 110 is electrically connected to conducting element 100 at a first location. Conducting element 130 is electrically connected to conducting element 100 at a second location 135. The electrical current flowing from element 110 to element 130 or vice versa makes a detour around conducting element 120, which extends in a direction with an arbitrary angle to elements 110 and 130. Hence, it becomes possible to provide a crossing between the conducting path constituted by elements 110/130 and element 120 by maintaining a single layer of conducting elements. An essential feature for enabling this is the conducting element 100 in the chip, which forms a part of the electrical path as described above. A vertical projection of the conducting element 120 onto the chip would cross the first conducting element 100 (located on the chip) between the first contact element 110 and the second contact element 130. In a further embodiment, an insulating layer 30, typically of silicone, is provided between the chip with conducting element 100 and conducting elements 110, 120, 130. Typically, elements 110, 120, 130 are formed from a common conductive layer or metallization layer provided on the first dielectric layer 30. FIG. 3b shows a schematic bottom view of the device shown in FIG. 3a, wherein four crossings of conducting elements are depicted, of which each crossing shows the characteristics described above and depicted in FIG. 3a.

Conducting element 100 is typically a conducting structure in one of the top layers of the semiconductor chip 10. It is typically not part of the circuitry of the chip, but designed only for the described purpose. It has two contact elements or contact pads 20, typically at its ends, where it is connected to conducting elements 110, 130.

During the design phase of the semiconductor device, the routing of the conducting elements in the layer of conducting elements is arranged. If it occurs that a crossing between two conducting elements in the metallization layer is necessary, the design according to the above described embodiments is employed. That is, in the mask for the production of the layer of conducting elements, one of the elements is separated at the location where the crossing with another conducting element would be necessary. Simultaneously, conducting element 100 is added to the layout of the semiconductor chip, designated to connect the separated conducting elements in the semiconductor device.

Figure 4A:
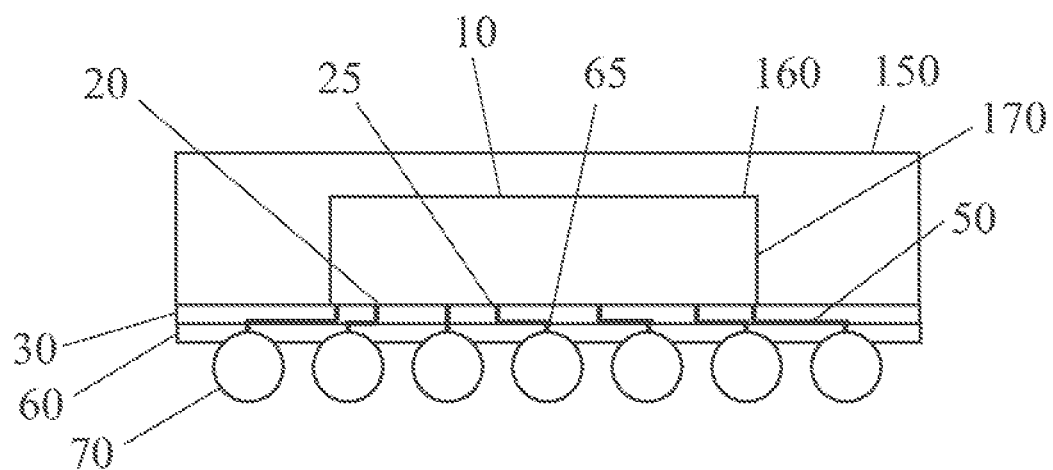
FIGS. 4a-4b show a further semiconductor device.
Figure 4B:
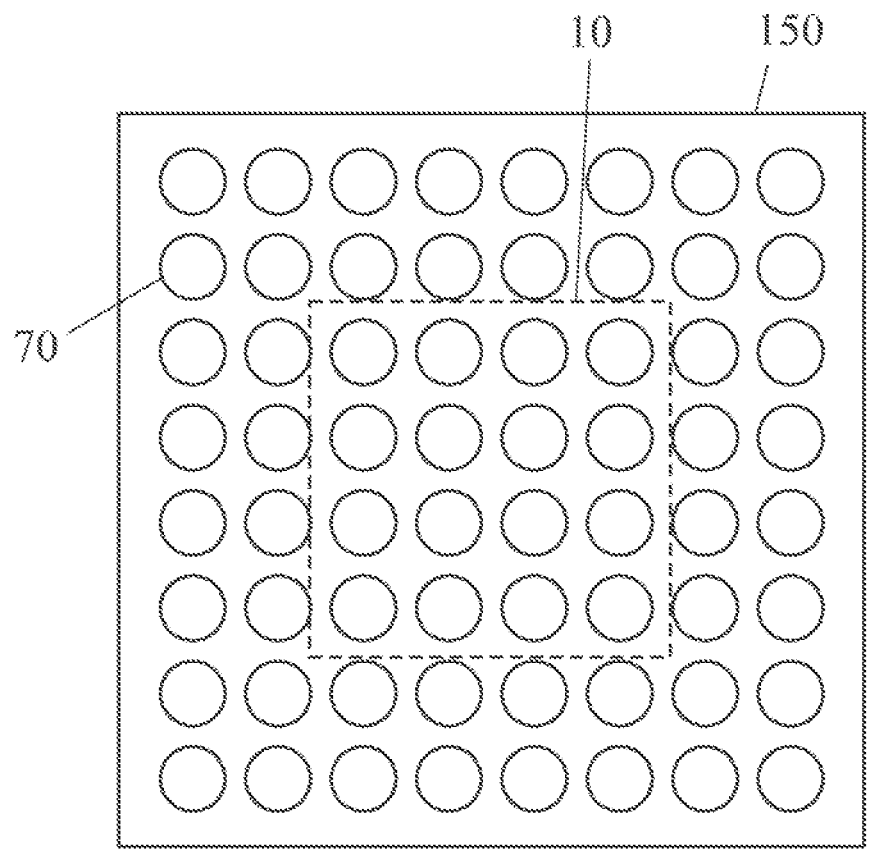
Figure 5A:
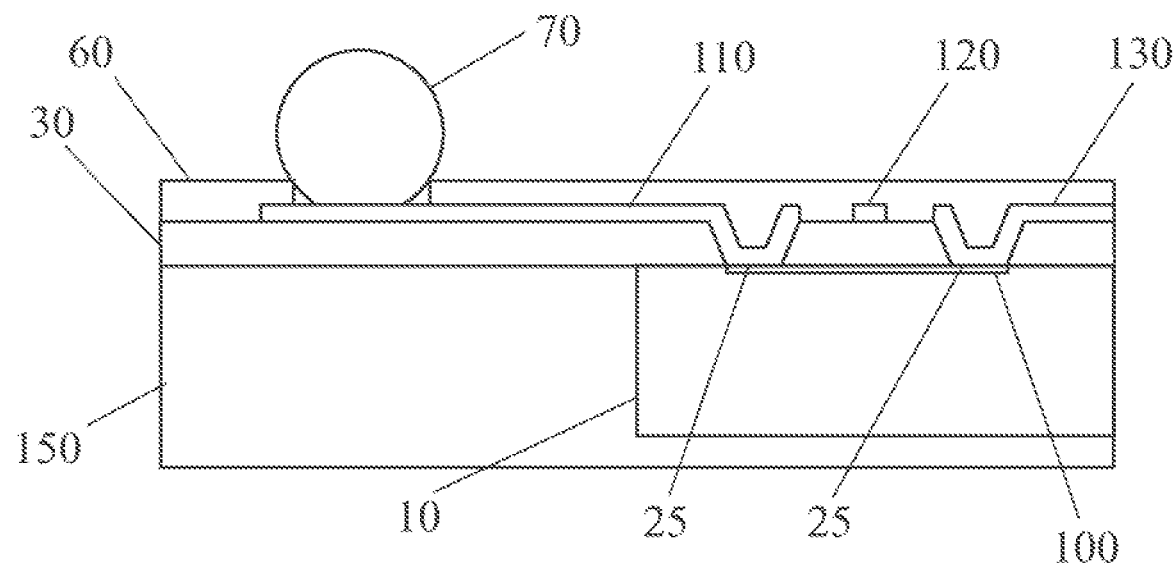
FIGS. 5a-5b show a detailed view of a semiconductor device according to an embodiment.
Figure 5B:
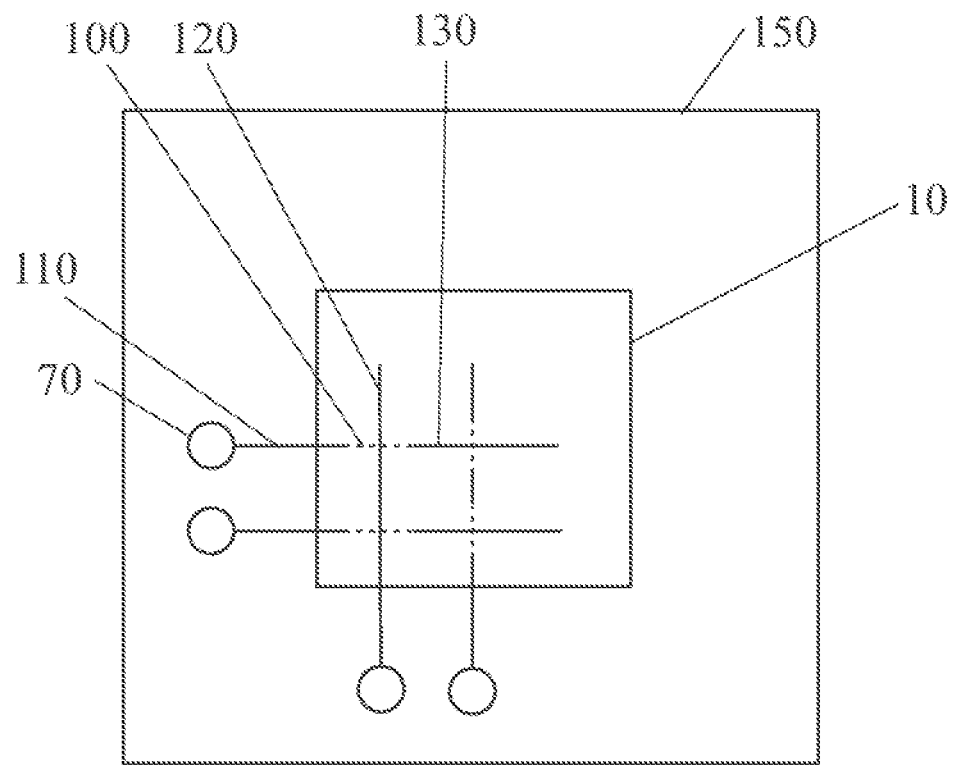

In a further embodiment, shown in FIGS. 5a and 5b, the above described technique of using a conduction line 100 in the chip as a functional element of the layer of conducting elements is applied to a chip 10 which is additionally encapsulated in a body 150 including a mold mass 240. This kind of assembly is also known as an embedded wafer level ball grid array (eWLB) and is shown in FIGS. 4a and 4b. The mold mass is typically a polymer, e.g. a polyimide or an epoxy resin, which includes a high amount of $SiO_2$ which may exceed 90 weight-percent. The mass covers a face 160 of the chip opposite the conducting layer, as well as the side faces 170. Typically, the conducting layer extends over the semiconductor chip and the encapsulating body 150. One effect of this structure is that the space available for the conducting layer greatly exceeds, which is particularly useful for the packaging of highly integrated semiconductor chips which require a high number of external connections and thus a package with a high pin count. For a given pitch of the printed circuit board to which the semiconductor device shall be applied, only a limited number of connections can be arranged under the footprint of the chip. Hence, by adding the mold mass 240 and extending the layer of conducting elements 50 and of solder balls 70 to the area of the encapsulating body 150, this area is greatly increased in comparison to the assembly without the encapsulating body, which is apparent from FIGS. 4a and 4b.

Figure 6A:
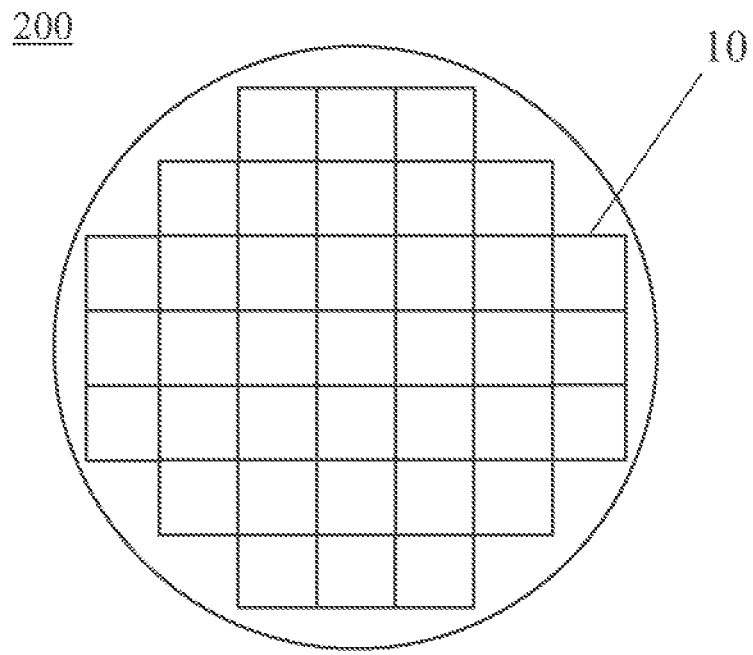
FIGS. 6a-6b show a semiconductor wafer and a reconstituted wafer according to an embodiment.
Figure 6B:
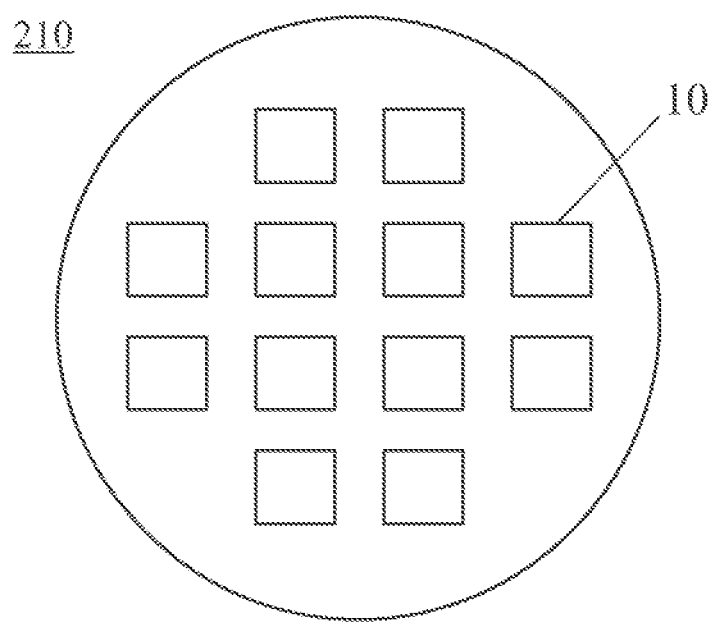

In the following, the manufacturing method for the aforementioned embedded wafer level ball grid array is described. The procedure is based on the dicing of a readily fabricated and tested wafer 200 into discrete semiconductor chips 10, the relocation of the semiconductor chips in a larger spacing then they have been in the wafer bond, and the addition of a molding compound or mold mass to be a placeholder between the chips. FIG. 6a schematically shows a semiconductor wafer 200 before undergoing this process, and FIG. 6b the resulting reconstituted or reconfigured wafer 210. In order to produce the latter, the following steps are carried out, which are depicted in FIGS. 7a to 7f:

7a: dicing the fabricated and tested semiconductor wafer 200 shown in FIG. 6a in order to achieve single semiconductor chips 10.

7b: Laminating a double sided adhesive tape 230 onto a metal carrier plate 220 in order to support the assembly during molding, wherein the tape 230 typically features thermo-release properties which allow the removal of the tape after molding.

7c: placing the diced chips 10 onto the mounted tape 230 with the active area facing down.

7d: encapsulating the mounted chips 10 by molding by using a molding compound 240.

7e: releasing the molded, reconfigured wafer 210 from the carrier plate 220.

7f: pealing off the adhesive tape from the molded wafer 210.

Typically, a liquid mold compound is used as it can be dispended and no melting time is needed. The reconfigured wafer 210 typically has a thickness similar to a normal wafer, i.e. about 300 µm. Hence, further processing steps such as the application of the metallization layer for the production of the layer of conducting elements may be carried out using equipment designed for wafer processing. Further processing steps in order to arrive at an embodiment are described in the following with respect to FIGS. 7g to 7i.

Figure 7A:
FIGS. 7a-7i show process steps according to an embodiment.
Figure 7B:
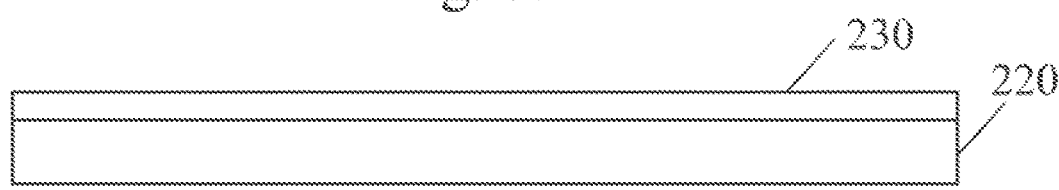
Figure 7C:
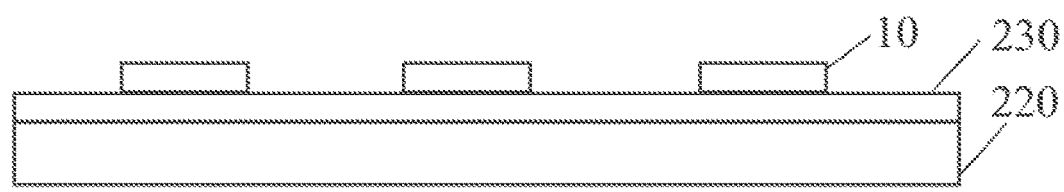
Figure 7D:
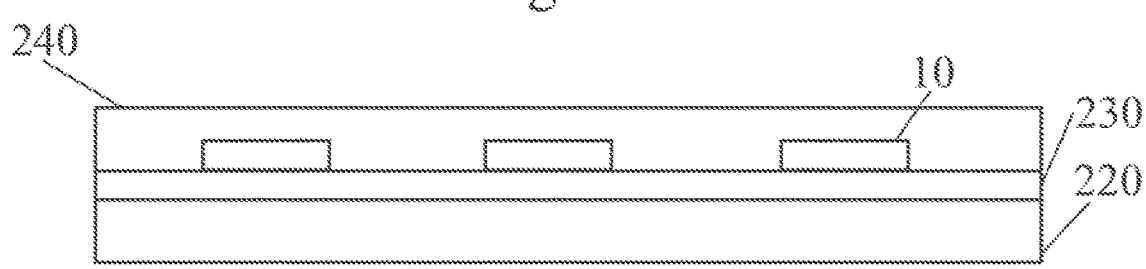
Figure 7E:
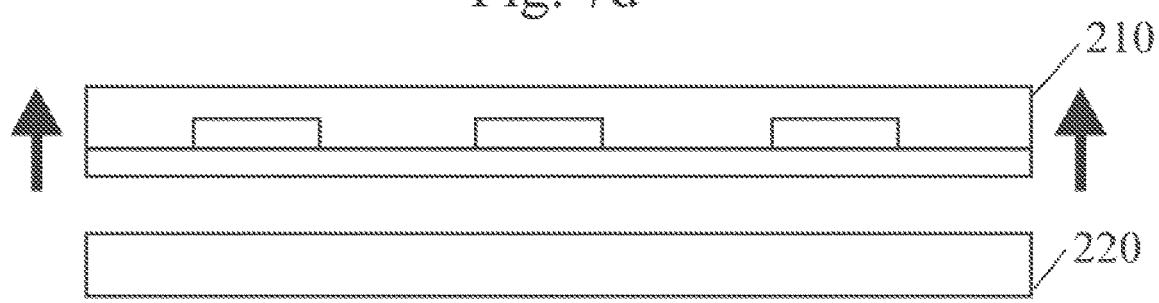
Figure 7F:
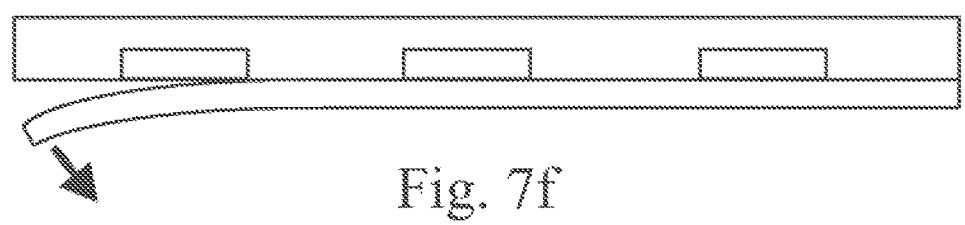
Figure 7G:
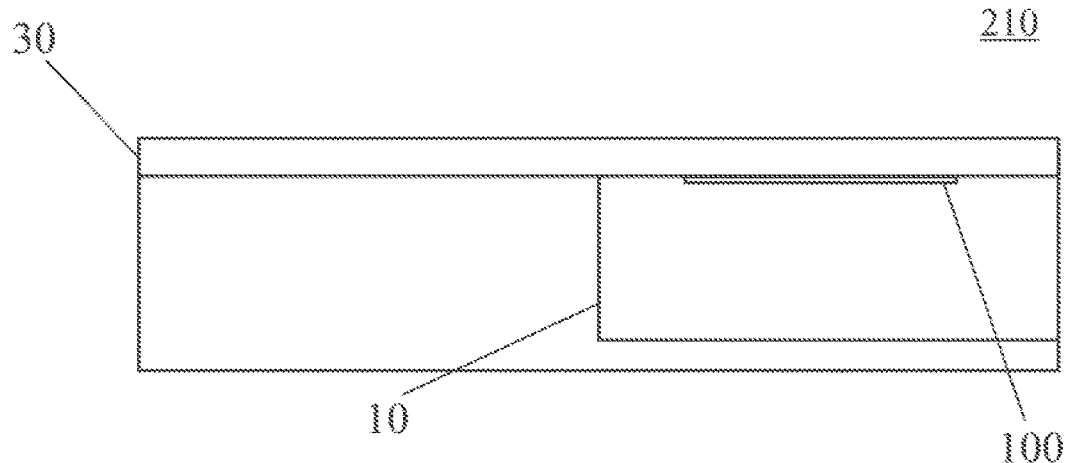
Figure 7H:
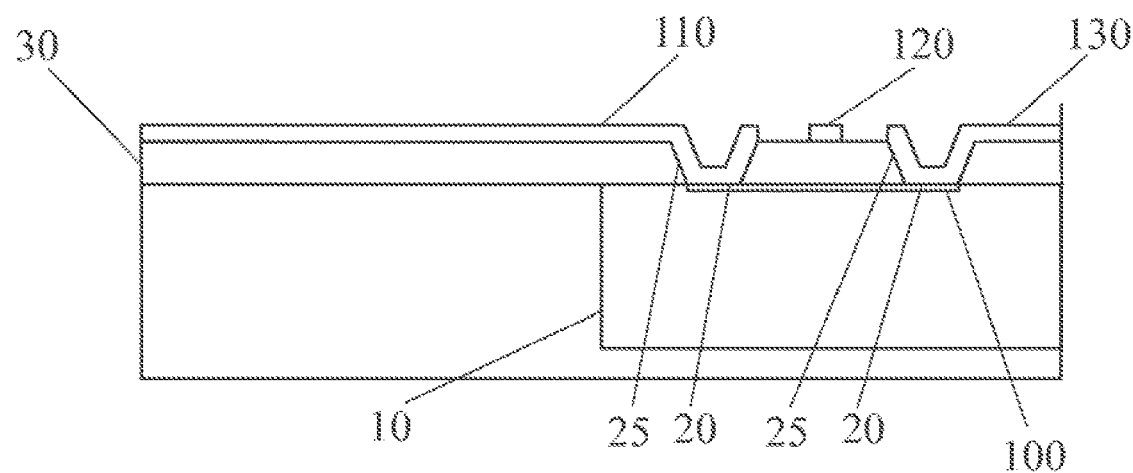
Figure 7I:
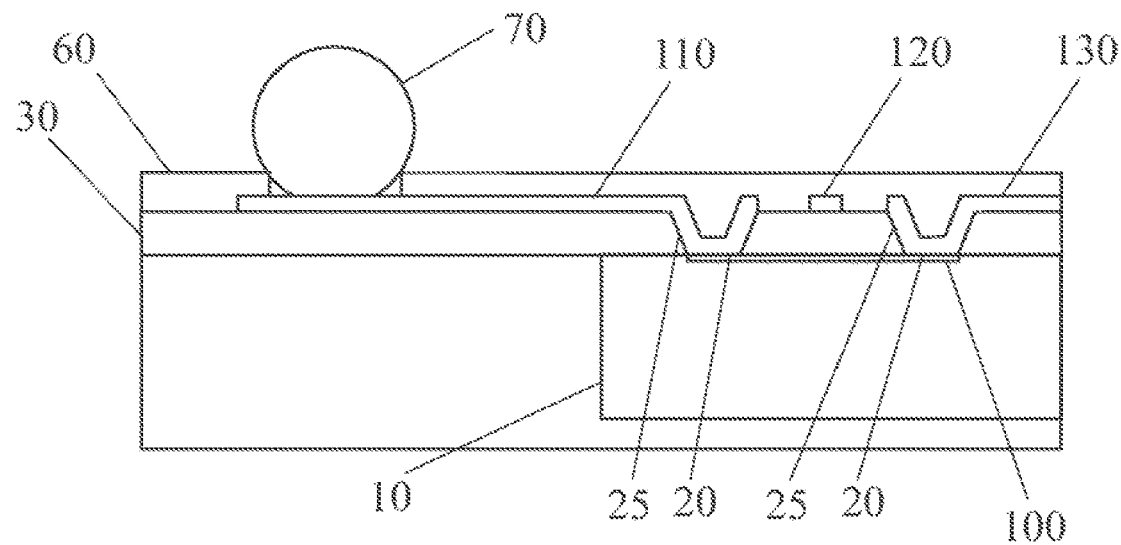

FIG. 7g shows how a first dielectric layer 30, which typically includes silicone, is applied to the face of the reconstituted wafer 210, wherein only a small segment of the wafer 210 is depicted. After contact holes 25 have been formed in the first dielectric layer 30, a metallization layer including copper or aluminium is provided on the first dielectric layer. FIG. 7h shows the metallization layer which is structured by etching during the manufacturing process in order to provide a number of conducting elements 110, 120, 130 (also referred to as conducting lines in the following). In a typical manufacturing process, the metal is sputtered on the silicone layer 30, covered with a resist layer, and exposed to radiation employing an exposure mask. After a development process, the produced structure is plated and stripped. A typical thickness of the produced structure of metallic conducting elements is in the range from 3 to 20 µm, more preferred from 4 to 8 µm. A typical width of the resulting conducting lines is 20 µm. Through contact holes 25 in the first dielectric layer 30, the conducting lines are in contact with the contact elements 20 or contact pads on the chips. A second dielectric layer 60 provided on the metallization layer typically includes polyimide. Via holes 65, the conducting lines 50 are in electrical contact with solder balls 70 which are placed on holes of the second dielectric layer 60.

Figure 8:
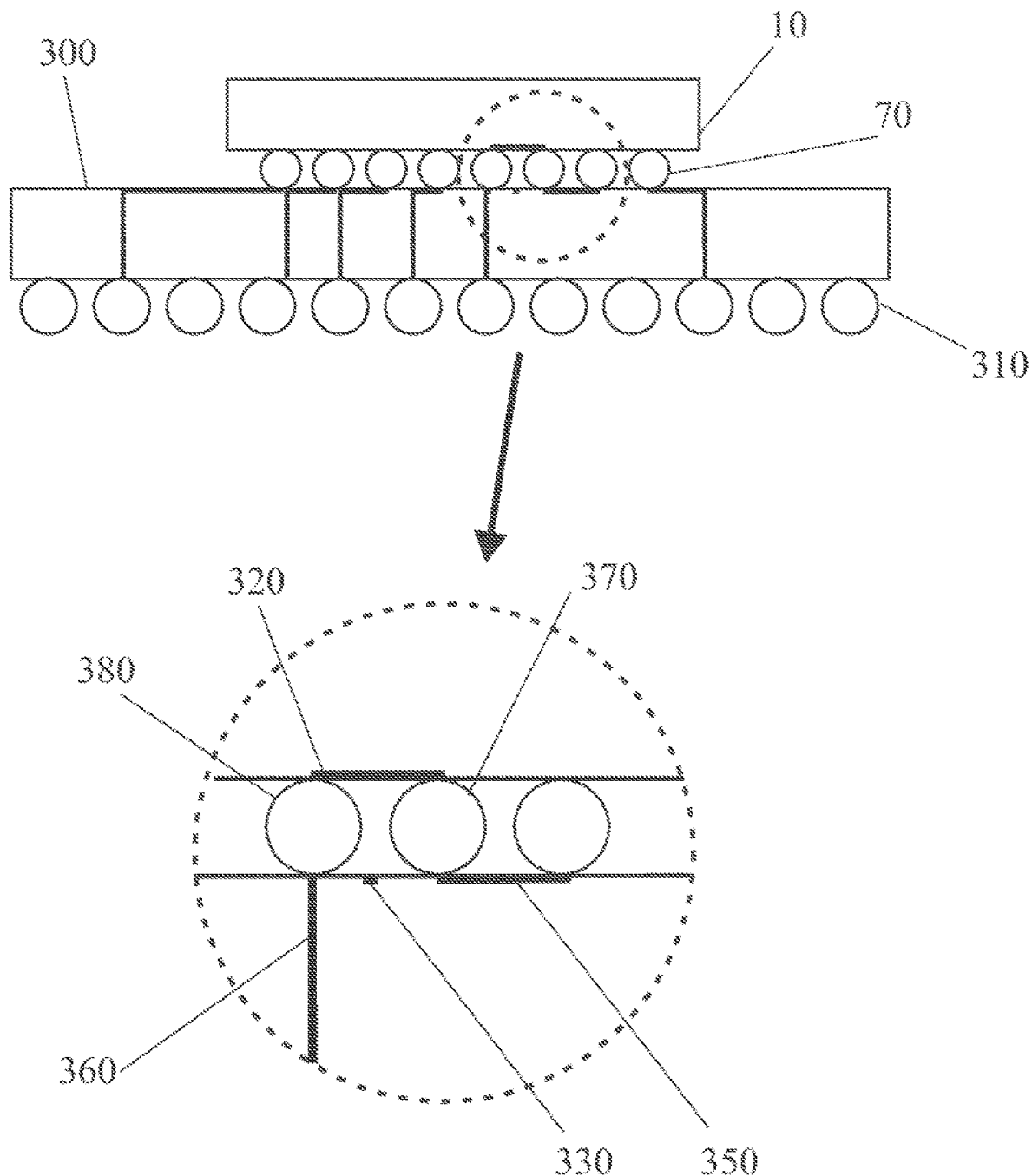
FIG. 8 shows an embodiment of a semiconductor device according to an embodiment.

In an embodiment shown in FIG. 8, the chip 10 is mounted on a substrate 300 with solder balls 70 as a connection between chip and substrate, respectively solder balls 310 between substrate and a printed circuit board (not shown). The electrical path from conduction element 350 to conduction element 360 is routed over solder ball 370 to conduction element 320 located in the semiconductor chip and to solder ball 380. By employing this indirect routing, a crossing of the path from element 350 to element 360 with the conduction element 330 is enabled, while the substrate has only a single layer of conducting elements.

Additionally to the embodiments described herein in detail, the concept of using a conducting element in the semiconductor chip as a functional part of an external layer of conducting elements may be applied to a variety of chip packaging technologies. These include, as non-limiting examples, Flip Chip technology or Carrier Wafer Level Ball grid arrays (CWLB). Thereby, a variety of contact variants to the outside may be employed, such as (non-limiting) the use of solder balls, pins or land grid arrays (LGA). A person skilled in the art can easily transfer the concept applied in the described embodiments to other technologies.

Figure 9:
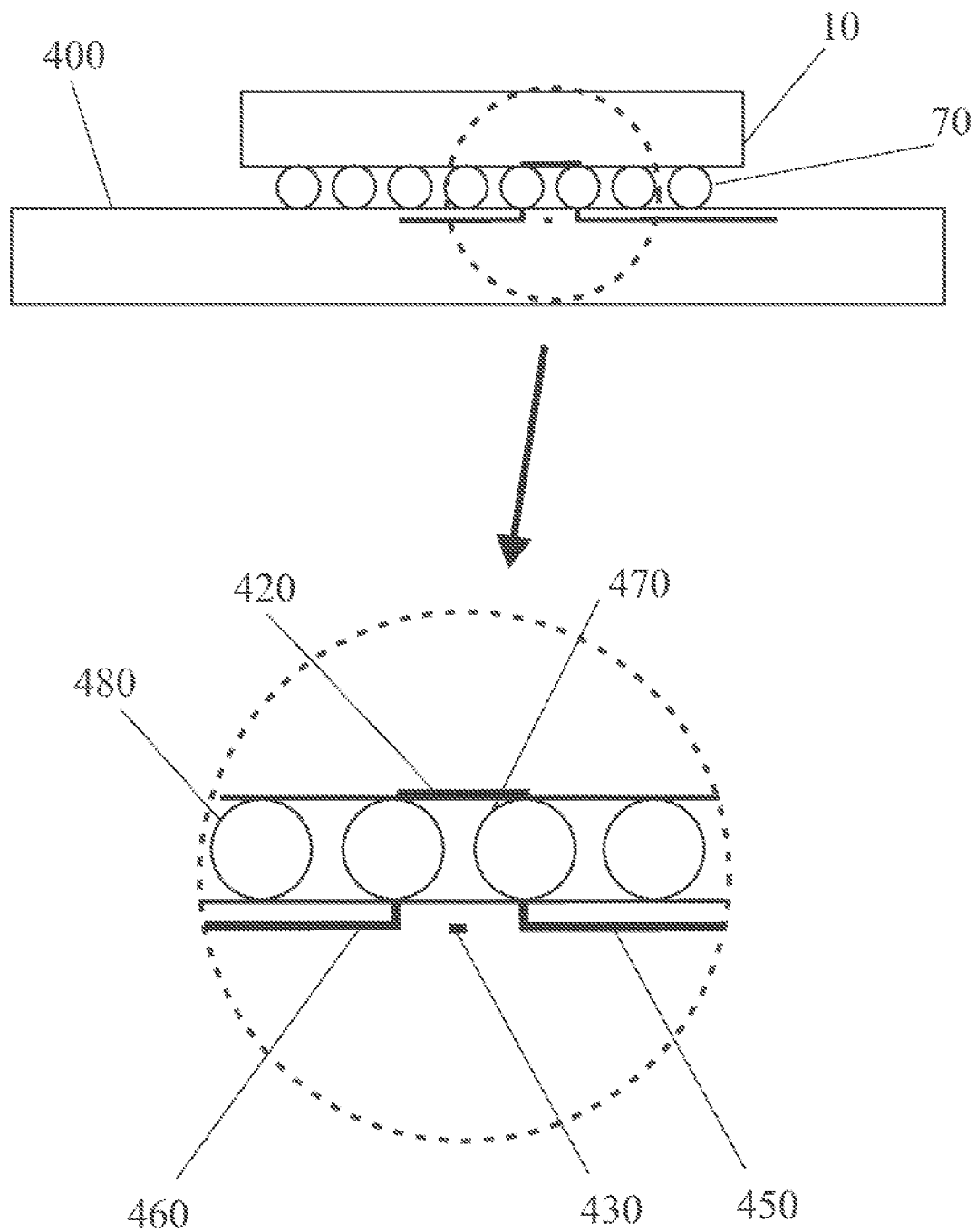
FIG. 9 shows a further embodiment of a semiconductor device according to an embodiment.

In an embodiment shown in FIG. 9, the chip 10 is mounted on a printed circuit board 400 with solder balls 70 as a connection between chip and board. The electrical path from conduction element 450 to conduction element 460 is routed over solder ball 470 to conduction element 420 located in the semiconductor chip, and to solder ball 480. By employing this indirect routing, a crossing of the path from element 450 to element 460 with the conduction element 430 is enabled at an arbitrary angle, while the printed circuit board has only a single layer of conducting elements.

Figure 10A:
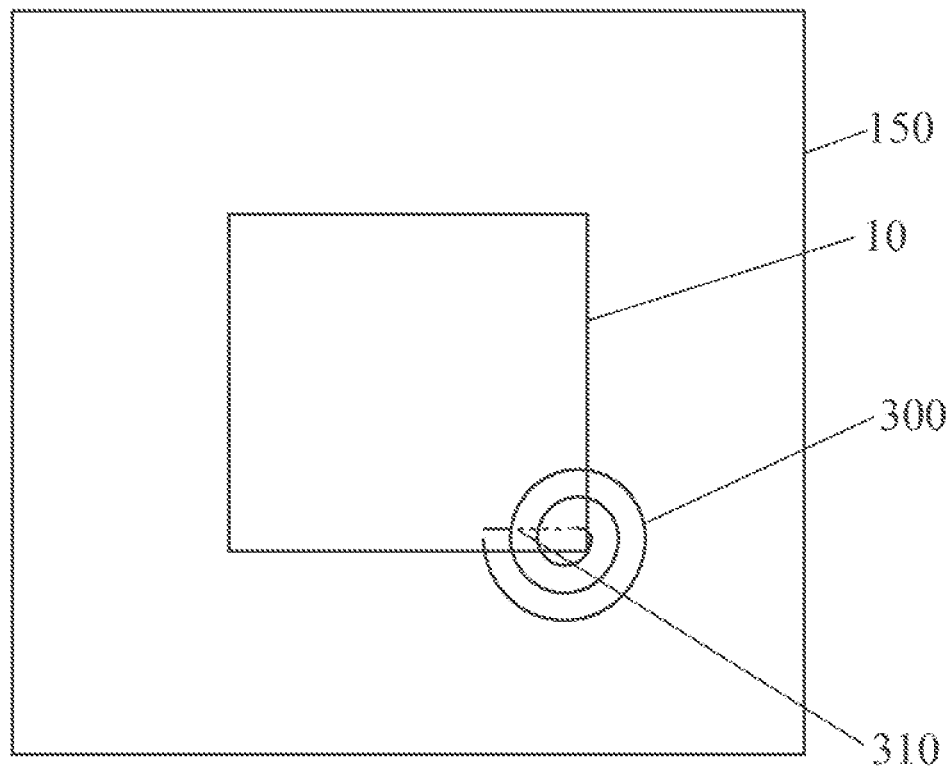
FIGS. 10a-10b show a further embodiment of a semiconductor device according to an embodiment.
Figure 10B:
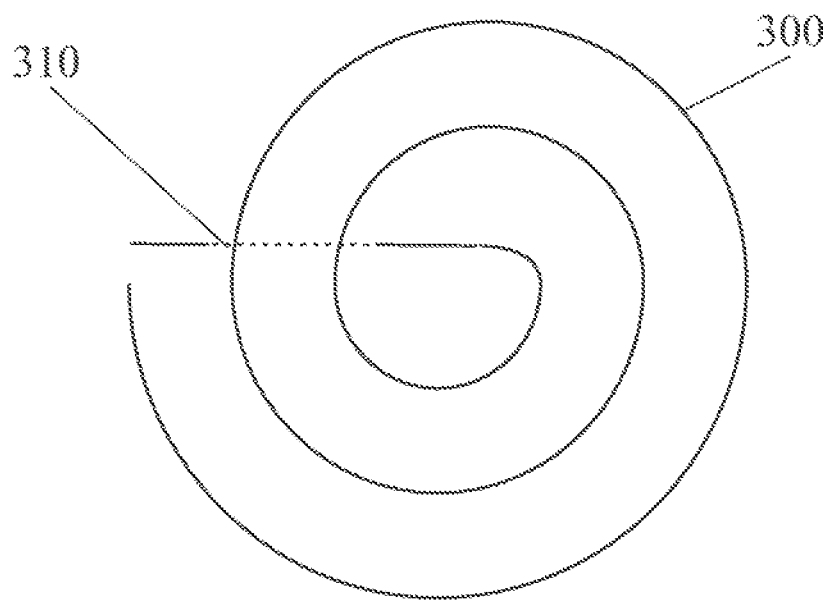

In an embodiment shown in FIGS. 10a and 10b, a coil 300 is part of the semiconductor device. The coil is substantially formed in the layer of conducting elements. In order to enable the coil to be formed from a single layer of conducting elements, conducting element 310 shown in FIG. 9 is provided as a part of the semiconductor chip 10. Best, the coil is only partly overlying semiconductor chip 10 and its main part overlies encapsulating body 150. Hence, undesirable interferences of the high frequency electromagnetic field of the coil with the semiconductor chip can be minimized.

What is claimed:

1. A semiconductor device, comprising:
a semiconductor chip having a face comprising a first contact element and a second contact element, the semiconductor chip having a backside opposite the face, and the semiconductor chip having a first sidewall and a second sidewall, the second sidewall opposite the first sidewall;
a mold mass in contact with the first sidewall and the second sidewall of the semiconductor chip, the mold mass having a top surface co-planar with the face of the semiconductor chip;
a first dielectric layer having a first side opposite a second side, the first side of the first dielectric layer on the face of the chip and on the mold mass;
a first contact and a second contact within the first dielectric layer, the first contact coupled to the first contact element of the semiconductor chip, and the second contact coupled to the second contact element of the semiconductor chip;
a metallization layer on the second side of the first dielectric layer, the metallization layer comprising a first conducting element, a second conducting element and a third conducting element, the first conducting element coupled to the first contact, the second conducting element coupled to the second contact, and the third conducting element between the first conducting element and the second conducting element; and
a second dielectric layer on the metallization layer.

2. The semiconductor device of claim 1, wherein the mold mass has a thickness greater than a thickness of the semiconductor chip.

3. The semiconductor device of claim 2, wherein the mold mass is on the backside of the semiconductor chip.

4. The semiconductor device of claim 1, wherein the first conducting element of the metallization layer extends laterally outside of the face of the semiconductor chip and beneath the mold mass.

5. The semiconductor device of claim 1, further comprising:
   a solder ball coupled to the metallization layer.

6. The semiconductor device of claim 5, wherein the solder ball is coupled to the first conducting element of the metallization layer.

7. The semiconductor device of claim 5, wherein the solder ball is coupled to the second conducting element of the metallization layer.

8. The semiconductor device of claim 5, wherein the solder ball is outside of the face of the semiconductor chip and is beneath the mold mass.

9. The semiconductor device of claim 1, wherein the semiconductor chip comprises a trace, the trace coupling the first contact element to the second contact element.

10. A semiconductor device, comprising:
    a chip having a front side and a backside, the backside opposite the front side, the chip having a first sidewall and a second sidewall between the front side and the backside, the second sidewall opposite the first sidewall, and the chip having electrical terminals which provide a contact to the outside world;
    a mold mass in contact with the first sidewall and the second sidewall of the chip;
    a first dielectric layer beneath the chip and beneath the mold mass;
    a metallization layer on the dielectric layer, the metallization layer comprising a first conducting element, a second conducting element and a third conducting element, the first conducting element extending through the first dielectric layer and coupled to a first one of the electrical terminals of the chip, the second conducting element extending through the dielectric layer and coupled to a second one of the electrical terminals of the chip, and the third conducting element between the first conducting element and the second conducting element; and
    a second dielectric layer on the metallization layer.

11. The semiconductor device of claim 10, wherein the mold mass has a thickness greater than a thickness of the chip.

12. The semiconductor device of claim 11, wherein the mold mass has a surface at a level above the backside of the chip.

13. The semiconductor device of claim 12, wherein the mold mass is on the backside of the chip.

14. The semiconductor device of claim 10, wherein the first conducting element of the metallization layer extends laterally beyond the first sidewall of the chip.

15. The semiconductor device of claim 14, wherein the second conducting element of the metallization layer extends laterally beyond the second sidewall of the chip.

16. The semiconductor device of claim 15, wherein the third conducting element of the metallization layer is confined between the first sidewall and the second sidewall of the chip.

17. The semiconductor device of claim 10, further comprising:
    a solder ball coupled to the metallization layer.

18. The semiconductor device of claim 17, wherein the solder ball is coupled to the first conducting element of the metallization layer, and wherein the solder ball is outside of a footprint of the chip.

19. The semiconductor device of claim 17, wherein the solder ball is coupled to the second conducting element of the metallization layer, and wherein the solder ball is outside of a footprint of the chip.

20. The semiconductor device of claim 10, wherein the chip comprises a trace, the trace coupling the first conducting element of the metallization layer to the second conducting element of the metallization layer.

* * * * *